United States Patent
Segervall

(10) Patent No.: US 6,667,870 B1
(45) Date of Patent: *Dec. 23, 2003

(54) FULLY DISTRIBUTED SLAVE ESD CLAMPS FORMED UNDER THE BOND PADS

(75) Inventor: Alan Erik Segervall, Half Moon Bay, CA (US)

(73) Assignee: Natiional Semiconductor Corporation, Santa Clara, CA (US)

(*) Notice: Subject to any disclaimer, the term of this patent is extended or adjusted under 35 U.S.C. 154(b) by 100 days.

This patent is subject to a terminal disclaimer.

(21) Appl. No.: 10/021,530

(22) Filed: Dec. 12, 2001

(51) Int. Cl.[7] ............................................... H05K 5/00
(52) U.S. Cl. ................................................ 361/111
(58) Field of Search ............................... 361/111, 760, 361/772, 54, 56; 257/678, 690, 691, 692

(56) References Cited

U.S. PATENT DOCUMENTS 5,239,440 A  8/1993 Merrill .................... 361/91
6,104,588 A  8/2000 Hariton et al. ............. 361/111

*Primary Examiner*—Pia Tibbits
(74) *Attorney, Agent, or Firm*—Mark C. Pickering

(57) ABSTRACT

The pads of a semiconductor die are protected from an electrostatic discharge (ESD) event by an ESD protection circuit that has a number of master corner clamps and a number of slave clamps that are controlled by the master corner clamps. The slave clamps are formed under the ESD plus and minus rings which, in turn, are formed under the pads, thereby providing a significant reduction in the height of the I/O cell, and improved ESD performance by reducing metalization IR drops.

18 Claims, 11 Drawing Sheets

FULLY DISTRIBUTED SLAVE ESD CLAMPS FORMED UNDER THE BOND PADS

BACKGROUND OF THE INVENTION

1. Field of the Invention

The present invention relates to an electrostatic discharge (ESD) protection circuit and, more particularly, to an ESD protection circuit that includes fully distributed slave ESD clamps that are formed under the bond pads.

2. Description of the Related Art

An electrostatic discharge (ESD) protection circuit is a circuit that protects the input/output (I/O) transistors of a semiconductor chip from an ESD event. An ESD event typically occurs when the chip is exposed to static electricity, such as when the pins or solder bumps of the chip are touched by an ungrounded person handling the chip, or when the chip slides across another surface on its pins or solder bumps.

For example, an ungrounded person handling a semiconductor chip can place a static electric charge as high as 2000V on the chip. This voltage is more than sufficient to destructively break down the gate oxide of the input/output transistors of the chip.

FIG. 1 shows a schematic diagram that illustrates a prior-art ESD protection circuit 100. As shown in FIG. 1, circuit 100, which provides ESD protection to a power pad 102, a ground pad 104, and a number of I/O pads 106, includes an ESD plus ring 110 and an ESD minus ring 112 that extend around the periphery of a semiconductor chip 114.

As further shown in FIG. 1, ESD protection circuit 100 includes a plurality of upper diodes D1 that are connected to ESD plus ring 110 and the pads 102, 104, and 106 so that each pad is connected to ESD plus ring 110 via a diode D1. In addition, a plurality of lower diodes D2 are connected to ESD minus ring 112 and the pads 102, 104, and 106 so that each pad is connected to ESD minus ring 112 via a diode D2. Circuit 100 also includes four corner clamps 116 that are connected to ESD plus ring 110 and ESD minus ring 112.

In operation, when an ESD event occurs, a first pad A, for example, is zapped positively with respect to a second pad B. In this situation, a zap current IZAP flows from first pad A through the adjacent diode D1 to ESD plus ring 110, and then on to the corner clamps 116. The corner clamps 116 are voltage controlled switches that each provide a low impedance pathway from ESD positive ring 110 to ESD negative ring 112 when an ESD event is present, and a high impedance pathway between rings 110 and 112 when an ESD event is not present.

When first pad A is zapped, the corner clamps 116 (which are shown open, not closed, in FIG. 1) close and the zap current IZAP flows through clamps 116 to ESD minus ring 112. From ring 112, the zap current IZAP flows through the diode D2 adjacent to second pad B, and then onto second pad B.

FIG. 2 shows a schematic diagram that illustrates an example of corner clamp 116. As shown in FIG. 2, clamp 116 includes a RC timing circuit 210, an inverter 212, and a switching transistor M1. Timing circuit 210, in turn, includes a resistor R that is connected to an ESD plus ring, such as ESD plus ring 110, and a capacitor C that is connected to resistor R and an ESD minus ring, such as ESD minus ring 112.

Inverter 212 includes a PMOS transistor M2 and a NMOS transistor M3. Transistor M2 has a source connected to ESD plus ring 110, a gate connected to resistor R and capacitor C, and a drain. Transistor M3 has a source connected to ESD minus ring 112, a gate connected to resistor R and capacitor C, and a drain connected to the drain of transistor M2. Further, switching transistor M1 has a source connected to ESD minus ring 112, a gate connected to the drains of transistors M2 and M3, and a drain connected to ESD plus ring 110.

In operation, when an ESD event occurs and the zap current IZAP flows onto ESD plus ring 110, the voltage on ESD plus ring 110 spikes up dramatically. The voltage on the gates of transistors M2 and M3 also spikes up but, due to the presence of RC timing circuit 110, the gate voltage lags the voltage on ESD plus ring 110.

As a result, the gate-to-source voltage of transistor M2 falls below the threshold voltage of transistor M2, thereby turning on transistor M2 for as long as the gate voltage lags the voltage on ring 110. When transistor M2 turns on, transistor M2 pulls up the voltage on the gate of transistor M1, thereby turning on transistor M1. When transistor M1 is turned on, clamp 200 provides a low impedance pathway from ESD plus ring 110 to ESD minus ring 112.

The ESD protection circuitry used on a semiconductor chip is commonly considered to be part of the I/O cell structure of the chip. Typically, each I/O cell includes a pad, such as power pad 102, ground pad 104, or an I/O pad 106, a section of an ESD plus ring, such as ring 110, and a section of an ESD minus ring, such as ring 112.

In addition, each I/O cell includes an upper diode, such as diode D1, that is connected between the pad and the ESD plus ring, and a lower diode, such as diode D2, that is connected between the pad and the ESD minus ring. Further, each I/O cell includes a section of a clean power ring, and a section of a clean ground ring. The clean power ring, which is supplied by a first power pad, and the clean ground ring, which is connected to a first ground pad, support the core circuitry of the semiconductor chip with substantially noise free power and ground connections.

Each I/O cell also includes a section of a dirty power ring, and a section of a dirty ground ring. The dirty power ring, which is supplied by a second power pad, and the dirty ground ring, which is connected to a second ground pad, support the noisy I/O circuits. In addition, each I/O cell typically includes I/O circuitry.

FIGS. 3A–3F show a series of plan views that illustrate an example of the physical layout of a prior art I/O cell 300. As shown in FIG. 3A, I/O cell 300, which is formed in a layer of semiconductor material 302, includes a diode 304, such as diode D1 of FIG. 1, that is formed in material 302. In addition, I/O cell 300 includes a diode 306, such as diode D2 of FIG. 1, that is formed in material 302.

Further, I/O cell 300 includes I/O circuitry 312 that is formed in semiconductor material 302. I/O circuitry 312 can include, for example, MOS and/or bipolar transistors. Cell 300 also includes a number of contacts 314 that are formed through a first layer of dielectric material to make an electrical connection with diodes 304 and 306 and I/O circuitry 312.

Referring to FIG. 3B, I/O cell 300 additionally includes a first pad P1 and a number of first regions 316 that are formed from a first layer of metal. Pad P1 and the first regions 316, which include first regions 316A and 316B, are formed so that pad P1 and the first regions 316 make electrical connections with contacts 314. Cell 300 also includes a number of vias 320 that are formed through a second layer of dielectric material to make electrical connections with pad P1 and the first regions 316.

Referring to FIG. 3C, I/O cell 300 additionally includes a second pad P2 and a number of second regions 322 that are formed from a second layer of metal. Pad P2 and the second regions 322, which include second regions 322-A, 322-B, and 322-C, are formed so that pad P2 and the second regions 322 make electrical connections with vias 320.

Cell 300 also includes a trace 324 that is formed from the second layer of metal. Trace 324 is connected to pad P2, second region 322-A, and second region 322-B. Cell 300 also includes a number of vias 330 that are formed through a third layer of dielectric material to make electrical connections with pad P2 and the second regions 322.

Referring to FIG. 3D, I/O cell 300 further includes a third pad P3, a section of a first ESD plus ring 340, and a section of a first ESD minus ring 342. In addition, I/O cell 300 includes a section of clean power line 344, and a section of a clean ground line 346. Further, I/O cell 300 includes a section of a dirty power line 350, and a section of a dirty ground line 352. Pad P3, rings 340 and 342, and lines 344, 346, 350, and 352 are formed from a third layer of metal.

Pad P3, rings 340 and 342, and lines 344, 346, 350, and 352 are also formed to make electrical connections with vias 330. Cell 300 additionally includes a number of vias 354 that are formed through a fourth layer of dielectric material to make electrical connections with pad P3, rings 340 and 342, and lines 344, 346, 350, and 352.

Referring to FIG. 3E, I/O cell 300 additionally includes a fourth pad P4, a second ESD plus ring 360, and a second ESD minus ring 362. In addition, I/O cell 300 includes a clean power line 364, a clean ground line 366, a dirty power line 370, and a dirty ground line 372. Pad P4, rings 360 and 362, and lines 364, 366, 370, and 372 are formed from a fourth layer of metal.

Pad P4, rings 360 and 362, and lines 364, 366, 370, and 372 are also formed to make electrical connections with vias 354. Cell 300 also includes a number of vias 374 that are formed through a fifth layer of dielectric material to make electrical connections with pad P4, rings 360 and 362, and lines 364, 366, 370, and 372.

Referring to FIG. 3F, I/O cell 300 further includes a fifth pad P5, a third ESD plus ring 380, and a third ESD minus ring 382. In addition, I/O cell 300 includes a clean power line 384, a clean ground line 386, a dirty power line 390, and a dirty ground line 392. Pad P5, rings 380 and 382, and lines 384, 386, 390, and 392 are formed from a fifth layer of metal. Pad P5, rings 380 and 382, and lines 384, 386, 390, and 392 are also formed to make electrical connections with vias 374.

Together, pads P1–P5 form a bonding pad, such as pad 102 of FIG. 1. Together, ESD plus rings 340, 360, and 380 form an ESD plus ring, such as ring 110. Together, ESD minus rings 342, 362, and 382 form an ESD minus ring, such as ring 112.

As further shown in FIG. 3F, I/O cell 300 has an I/O cell height X that is measured laterally from the edge of the die and includes the widths of pad P5, rings 380 and 382, and lines 384, 386, 390, and 392. Pad P5, the pair of rings 380 and 382, the pair of lines 384 and 386, and the pair of lines 390 and 392 each require about the same amount of silicon real estate.

In operation, when an ESD event occurs on pad P5, the voltage spike passes through vias 374 to pad P4, and from pad P4 through vias 354 to pad P3. The voltage spike continues through vias 330 to pad P2, and from pad P2 through trace 324 to region 322A. The spike continues through vias 320 to region 316A, and from region 316A through contact 314 to diode D1.

The voltage spike passes through diode D1, through contact 314 to region 316-B, and from region 316-B to via 320, and then to region 322-B. From region 322-B, the spike continues to via 330, and then to ESD plus ring 340. From ESD plus ring 340, the spike moves to ESD plus rings 360 and 380 by vias 354 and 374.

Although ESD protection circuit 100, corner clamp 116, and I/O cell 300 function satisfactorily, there is a need for alternate ESD protection circuits and layouts.

SUMMARY OF THE INVENTION

The present invention provides an ESD protection circuit that protects the pads of a semiconductor die from an electrostatic discharge (ESD) event. An electrostatic discharge (ESD) protection circuit in accordance with the present invention includes an ESD plus ring and an ESD minus ring that are formed on the die around the periphery of the die. The ESD protection circuit also includes a trigger ring that is formed on the die around the periphery of the die, and a plurality of first clamps that are formed on the die.

Each first clamp has a first diode and a spaced-apart second diode that are formed on the die. The first diode is connected to a pad and the ESD plus ring, while the second diode is connected to the pad and the ESD minus ring. Each first clamp also has a first transistor and a second transistor. The first transistor is connected to the ESD plus ring, the trigger ring, and a first node. The second transistor is connected to the ESD minus ring, the trigger ring, and the first node. Each first clamp further includes a third transistor that is connected to the ESD plus ring, the ESD minus ring, and the first node.

A better understanding of the features and advantages of the present invention will be obtained by reference to the following detailed description and accompanying drawings that set forth an illustrative embodiment in which the principles of the invention are utilized.

DETAILED DESCRIPTION

Figure 4:
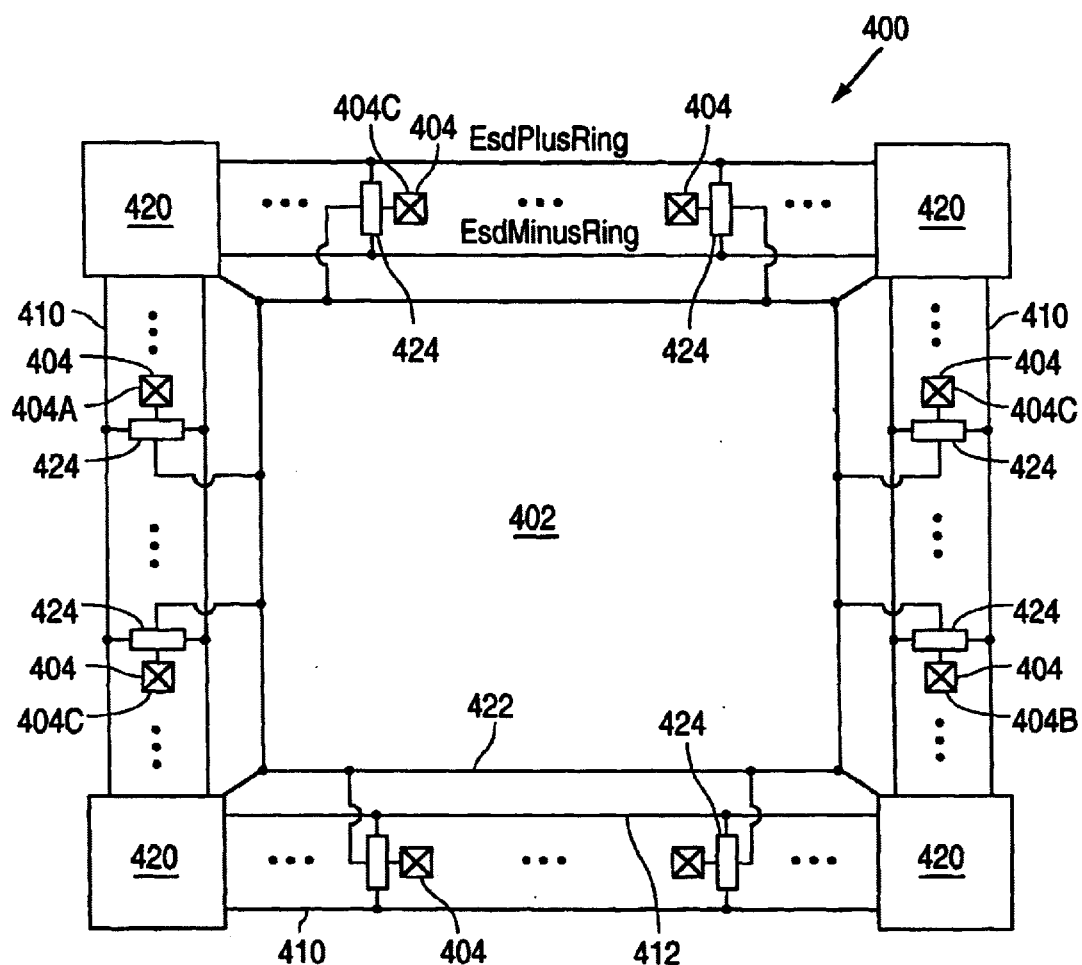
FIG. 4 is a schematic diagram illustrating an electrostatic discharge (ESD) protection circuit 400 in accordance with the present invention.
Figure 3A:
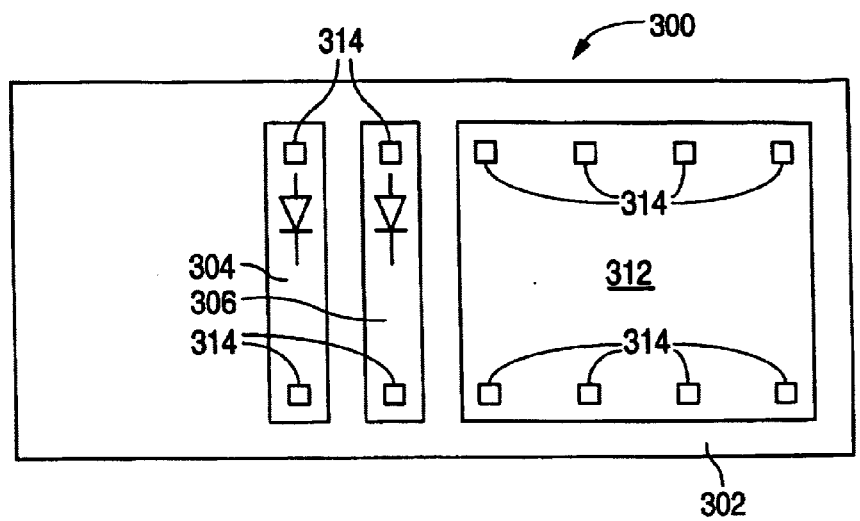
FIGS. 3A–3F are a series of plan views that illustrate an example of the physical layout of a prior art I/O cell 300.
Figure 3B:
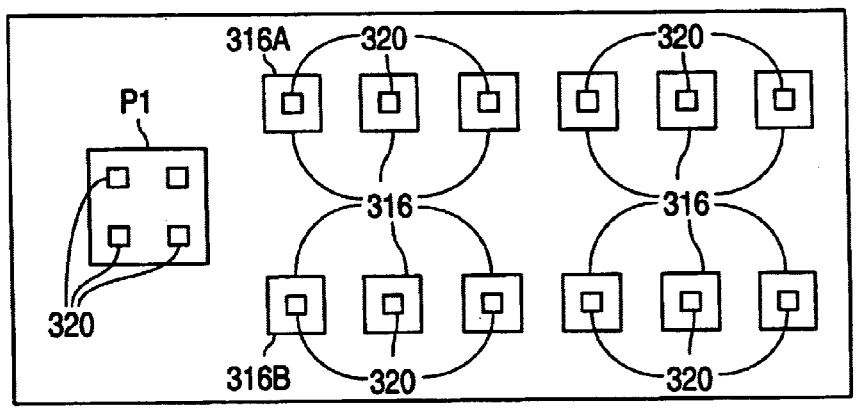
Figure 3C:
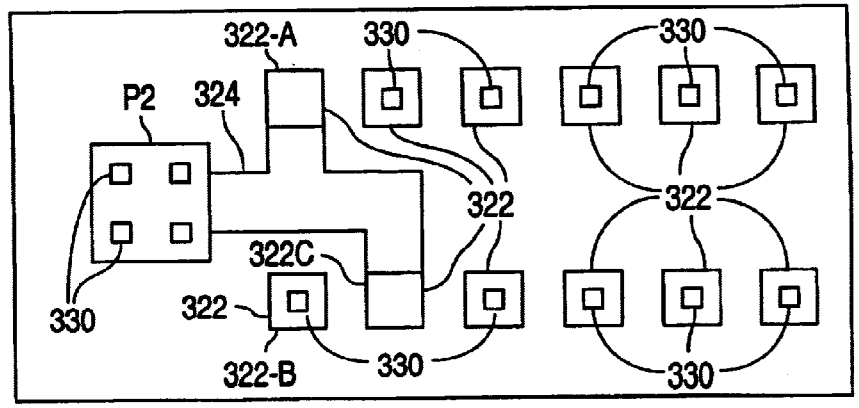
Figure 3D:
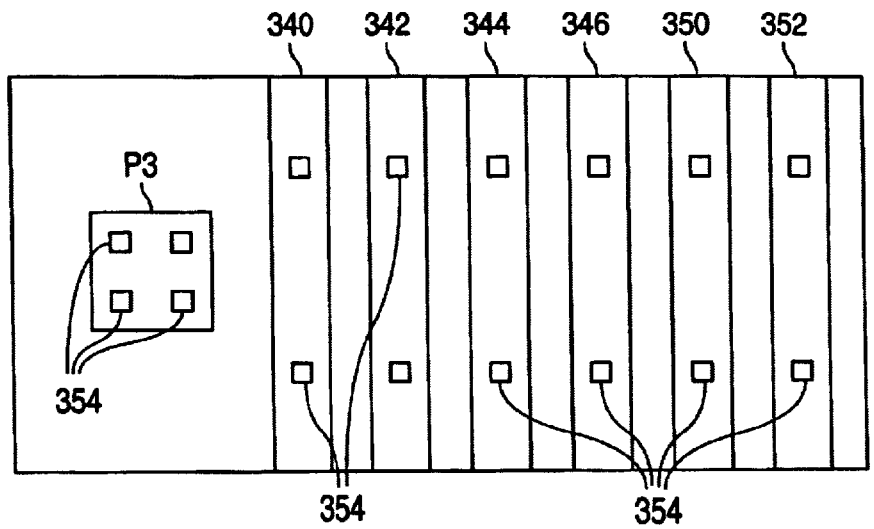
Figure 3E:
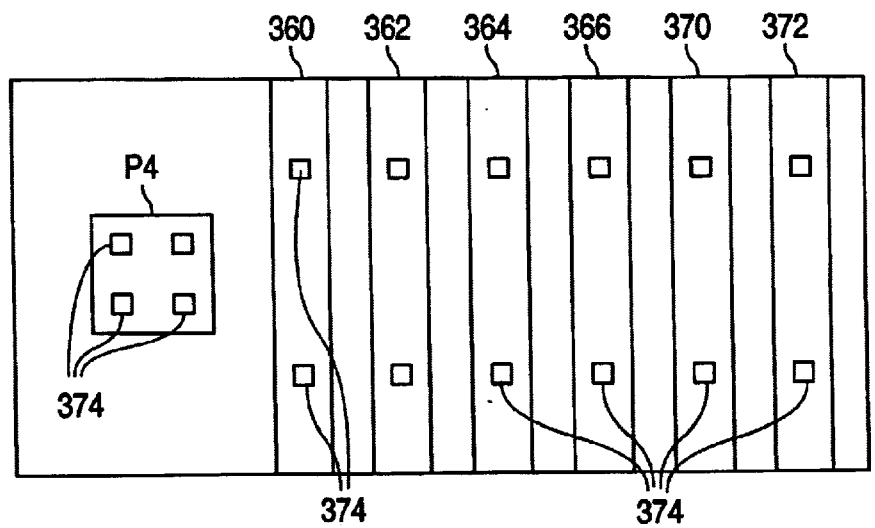
Figure 3F:
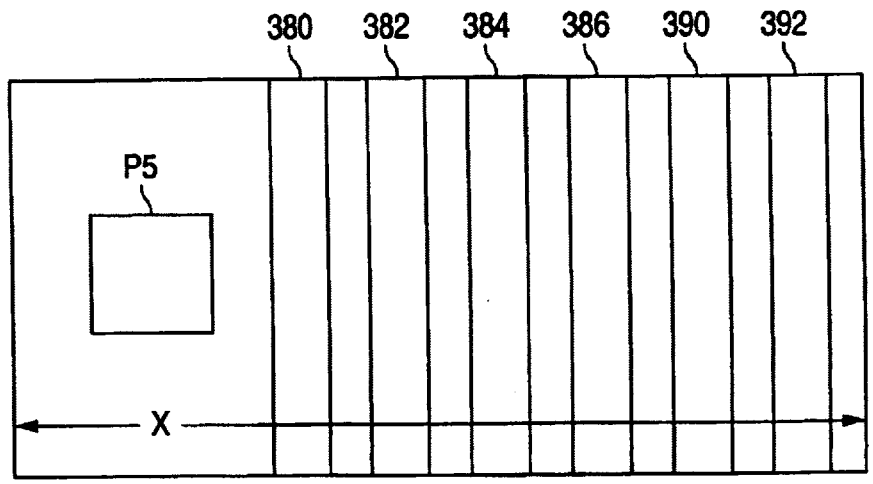

FIG. 4 shows a schematic diagram that illustrates an electrostatic discharge (ESD) protection circuit 400 in accordance with the present invention. As shown in FIG. 4, circuit 400 is formed on a semiconductor die 402 that has a number of bond pads 404, including a power pad 404A, a ground pad 404B, and I/O pads 404C.

As further shown in FIG. 4, ESD protection circuit 400 also includes an ESD plus ring 410 and an ESD minus ring 412 that extend around the periphery of die 402. In addition, circuit 400 includes four master corner clamps 420 that are connected to ESD plus ring 410 and ESD minus ring 412, and a trigger ring 422 that extends around the periphery of die 402 to connect to each corner clamp 420. Circuit 400 further includes a plurality of slave clamps 424 that are connected to the bond pads 404, ESD plus ring 410, ESD minus ring 412, and trigger ring 422.

Figure 5:
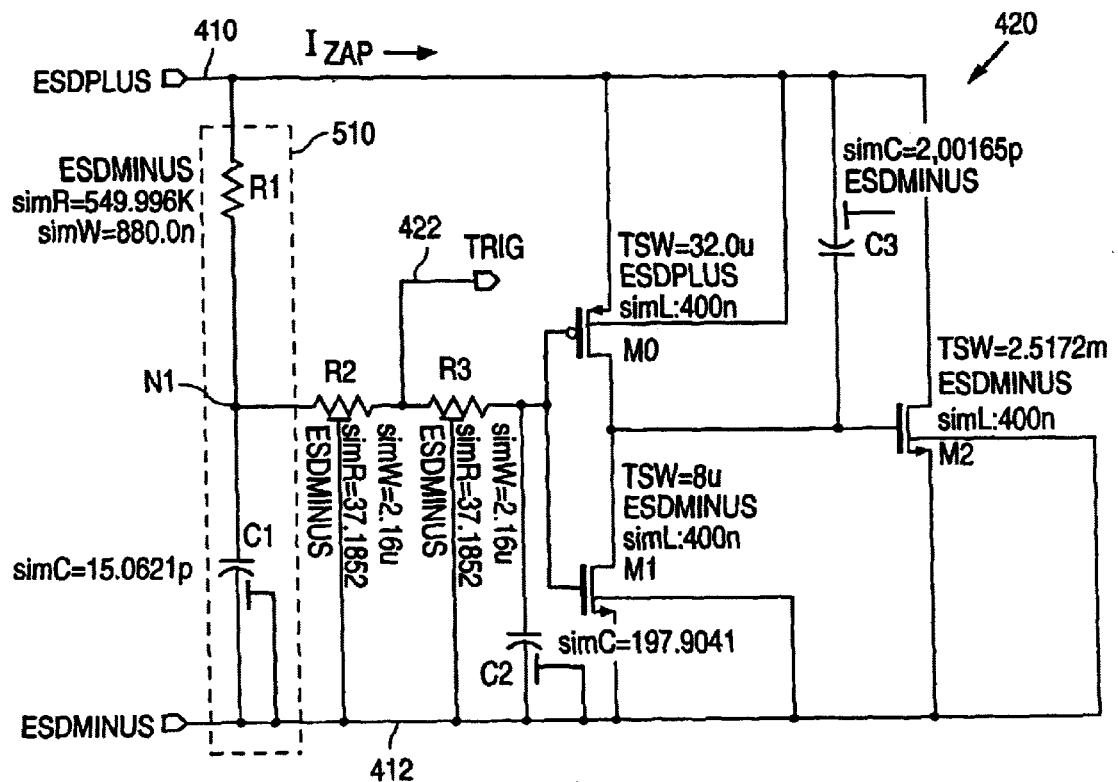
FIG. 5 is a schematic diagram illustrating a master corner clamp 420 in accordance with the present invention.

FIG. 5 shows a schematic diagram that illustrates master corner clamp 420 in accordance with the present invention. As shown in FIG. 5, corner clamp 420 includes a RC timing circuit 510 that is connected to ESD plus and minus rings 410 and 412. Timing circuit 510, in turn, includes a resistor R1 that is connected to a node N1 and ESD plus ring 410, and a capacitor C1 that is connected to node N1 and ESD minus ring 412. Resistor R1 and capacitor C1 can have, for example, a 8.25 uS time constant.

As further shown in FIG. 5, master corner clamp 420 includes a p-channel transistor M0 and an n-channel transistor M1, which together function as an inverter, and an ESD switching transistor M2. Transistor M0 has a source that is connected to ESD plus ring 410, a gate, and a drain. Transistor M1 has a source that is connected to ESD minus ring 412, a drain that is connected to the drain of transistor M0, and a gate that is connected to the gate of transistor M0.

In the example shown in FIG. 5, transistors M0 and M1 have equal lengths and a width ratio of 4:1 (transistor M0 is four times wider than transistor M1). If the device ratio is too small (M1 too large), then transistor M1 may turn on prematurely and shut off the clamp during an ESD transient.

Transistor M2 has a source that is connected to ESD minus ring 412, a drain that is connected to ESD plus ring 410, and a gate that is connected to the drains of transistors M0 and M1. In the example shown in FIG. 5, transistor M2 has a width-to-length ratio W/L of 2517.2 um/400 nm.

Master corner clamp 400 optionally includes a capacitor C2 and a capacitor C3. Capacitor C2 has a first side that is connected to the gates of transistors M0 and M1, and a second side that is connected to ESD minus ring 412. Capacitor C3 has a first side that is connected to ESD plus ring 410, and a second side that is connected to the gate of transistor M2. The capacitance of capacitor C3 is similar to the gate capacitance of transistor M2, this relative sizing causes the gate of M2 to be pulled high more rapidly so that the circuit responds better to very fast ESD transients such as the Machine Model and charged device model (CDM).

Master corner clamp 420 also optionally includes a resistor R2 and a resistor R3. Resistor R2 has a first end that is connected to node N1, and a second end that is connected to trigger line 422. Resistor R3 has a first end that is connected to trigger line 422, and a second end that is connected to the gates of transistors M0 and M1.

Resistors R2–R3, which are approximately 37 ohms, act as antenna diodes that are utilized to prevent a charge from accumulating on node N1 during the fabrication of clamp 420. If resistors R2–R3 are not utilized, node N1, trigger line 422, and the gates of transistors M0 and M1 are connected together.

In operation, when an ESD event occurs, a zap current IZAP flows onto ESD plus ring 410, and the voltage on ESD plus ring 410 spikes up dramatically. The voltage on the gates of transistors M0 and M1 also spikes up but, due to the presence of RC timing circuit 510, the gate voltage lags the voltage on ESD plus ring 410.

As a result, the gate-to-source voltage of transistor M0 falls below the threshold voltage of transistor M0, thereby turning on transistor M0 for as long as the gate voltage lags the voltage on ring 410. When transistor M0 turns on, transistor M0 pulls up the voltage on the gate of transistor M2, thereby turning on transistor M2. When transistor M2 is turned on, clamp 420 provides a low impedance pathway from ESD plus ring 410 to ESD minus ring 412.

When capacitor C2 is utilized, capacitor C2 substantially reduces the effect of Miller capacitance on the gates of transistors M0 and M1. During an ESD event, as the voltage on the source of transistor M0 increases, the Miller capacitance of transistor M0 pulls up the voltage on the gates of transistors M0 and M1.

This is an undesirable condition because if transistor M1 turns on during an ESD event, clamp 420 will fail. Although capacitor C1 limits the ability of transistor M1 to turn on as a result of Miller capacitance, capacitor C2 insures that transistor M1 does not turn on during an ESD event.

When capacitor C3 is utilized, capacitor C3 reduces the turn on time of transistor M2 which reduces the peak voltage that results from a very fast ESD transient. Capacitor C3 stores a charge that reduces the additional charge that is required to turn on transistor M2. As a result, less time is required to turn on transistor M2 after transistor M0 turns on and conducts. To provide significant improvement, the capacitance of capacitor C3 should be similar to the gate capacitance of transistor M2.

Figure 6:
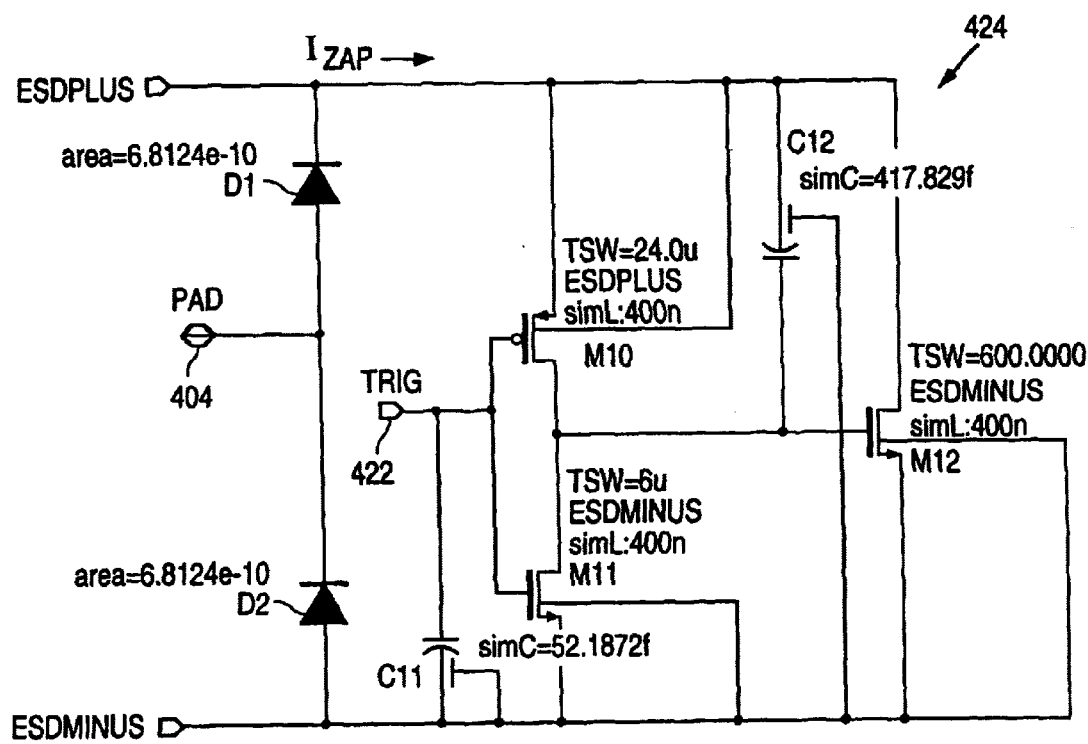
FIG. 6 is a schematic diagram illustrating a slave clamp circuit 424 in accordance with the present invention.

FIG. 6 shows a schematic diagram that illustrates slave clamp circuit 424 in accordance with the present invention. As shown in FIG. 6, slave clamp circuit 424 includes a first diode D1 and a second diode D2. Diode D1 has an input that is connected to a pad 404, and an output that is connected to ESD plus line 410. Diode D2 has an input that is connected to ESD minus line 412, and an output that is connected to pad 404.

Slave clamp circuit 424 also includes a p-channel transistor M10 and an n-channel transistor M11, which together function as an inverter, and an ESD switching transistor M12. Transistor M10 has a source that is connected to ESD plus ring 410, a gate that is connected to trigger line 422, and a drain. Transistor M11 has a source that is connected to ESD minus ring 412, a drain that is connected to the drain of transistor M10, and a gate that is connected to the gate of transistor M10 and to trigger line 422.

In the example shown in FIG. 6, transistors M10 and M11 have equal lengths and a width ratio of 4:1 (transistor M10 is four times wider than transistor M11). If the device ratio is too small (M1 too large), then transistor M11 may turn on prematurely and shut off the clamp during an ESD transient.

Transistor M12 has a source that is connected to ESD minus ring 412, a drain that is connected to ESD plus ring 410, and a gate that is connected to the drains of transistors M10 and M11. The width of transistor M12 need not be large since there are many transistors M2 and M12 in parallel. In the example shown in FIG. 6, transistor M12 has a width-to-length ratio W/L of 600 um/400 nm.

Slave clamp circuit 424 optionally includes a capacitor C11 and a capacitor C12. Capacitor C11 has a first side that is connected to the gates of transistors M10 and M11, and a second side that is connected to ESD minus ring 412. Capacitor C12 has a first side that is connected to ESD plus ring 410, and a second side that is connected to the gate of transistor M12. The capacitance of capacitor C12 is similar to the gate capacitance of transistor M12.

In operation, when an ESD event occurs, a zap current IZAP flows onto ESD plus ring 410, and the voltage on ESD plus ring 410 spikes up dramatically. The voltage on the gates of transistors M10 and M11 also spikes up but, due to the presence of RC timing circuit 510 via trigger line 422, the gate voltage lags the voltage on ESD plus ring 410.

As a result, the gate-to-source voltage of transistor M10 falls below the threshold voltage of transistor M10, thereby turning on transistor M10 for as long as the gate voltage lags the voltage on ESD plus ring 410. When transistor M10 turns on, transistor M10 pulls up the voltage on the gate of transistor M12, thereby turning on transistor M12. When transistor M12 is turned on, slave clamp 424 provides a low impedance pathway from ESD plus ring 410 to ESD minus ring 412.

When capacitor C11 is utilized, capacitor C11 substantially reduces the effect of Miller capacitance on the gates of transistors M10 and M11. Although capacitor C1 limits the ability of transistor M11 to turn on as a result of Miller capacitance, capacitor C11 insures that transistor M11 does not turn on during an ESD event.

When capacitor C12 is utilized, capacitor C12 reduces the turn on time of transistor M12. Capacitor C12 stores a charge that reduces the additional charge that is required to turn on transistor M12. As a result, less time is required to turn on transistor M12 after transistor M10 turns on and conducts. To provide significant improvement, the capacitance of capacitor C12 should be similar to the gate capacitance of transistor M12.

One advantage of the present invention is that a large effective clamp size can be obtained with smaller device sizes because the effective clamp size is the sum of each master corner clamp and each slave clamp circuit. Another advantage of the present invention is that the effective clamp size scales directly with the pin count. As a result, a chip with a larger pin count has a larger effective clamp size than a chip with a smaller pin count. Further, the present invention also allows reliable ESD protection to be added to an I/O cell as easily as placing a bond pad. This reduces I/O library development time, and the risk of ESD failures by using a proven design.

Another advantage of the present invention over prior art approaches which utilize only corner clamps is that the distance the ESD current ($I_{ZAP}$) has to travel (and it's associated IR drop/voltage buildup) before the current is shunted to the ESD minus ring 412 is minimized. In the present invention, if pad 404B (see FIG. 4) is zapped positively with respect to adjacent pad 404C, the ESD current flows from pad 404B through diode D1 of the slave clamp circuit associated with pad 404B to ESD plus ring 410. The ESD current then immediately flows through transistor M12 of the slave clamp circuit associated with pad 404B to ESD minus ring 412. Since there are multiple clamp transistors M12 in adjacent pads, these transistors also share in shunting the current to ESD minus ring 412. The current then conducts out the bottom diode D2 of pad 404C, and out the bond pad 404C.

Figure 1:
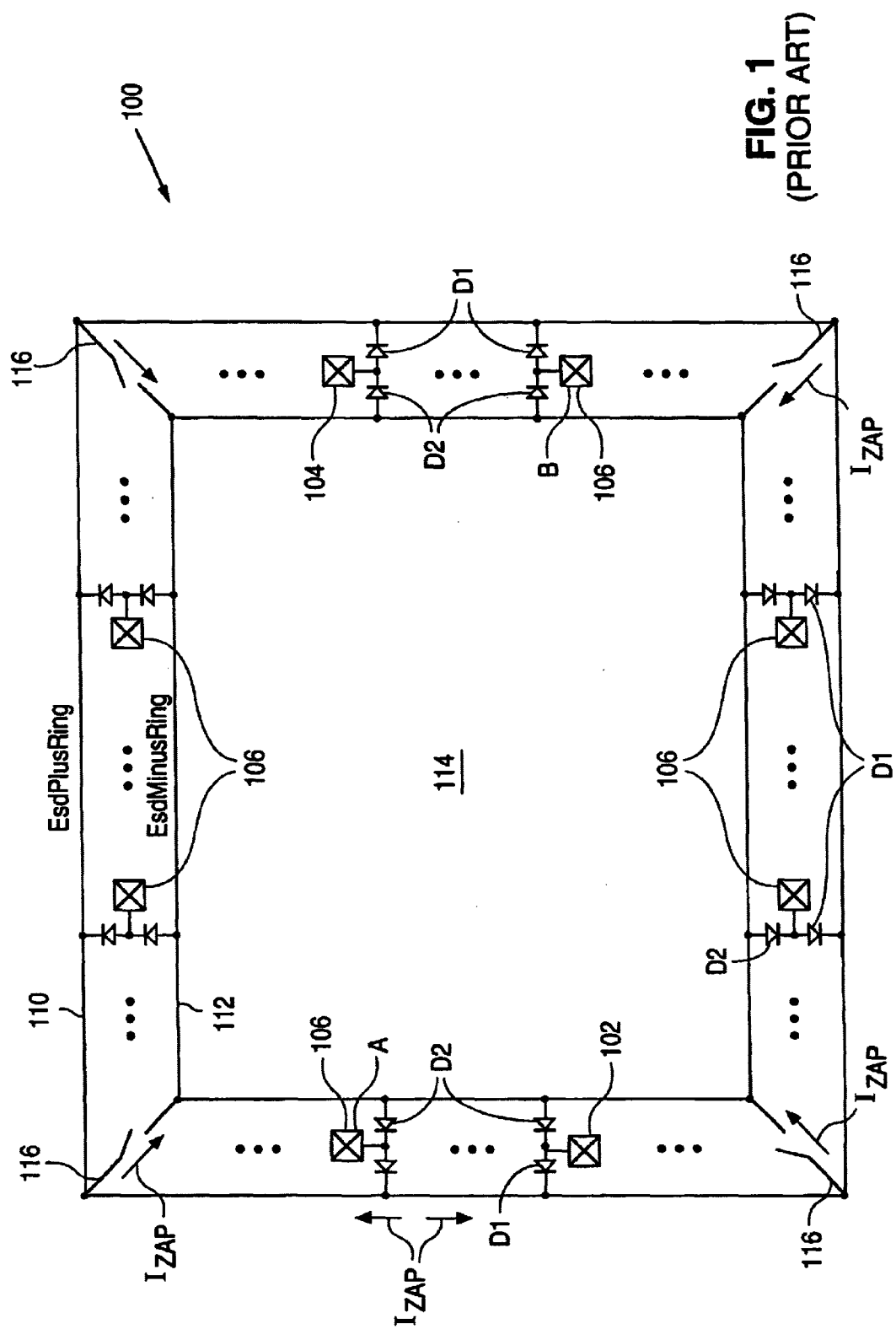
FIG. 1 is a schematic diagram illustrating a prior-art ESD protection circuit 100.
Figure 2:
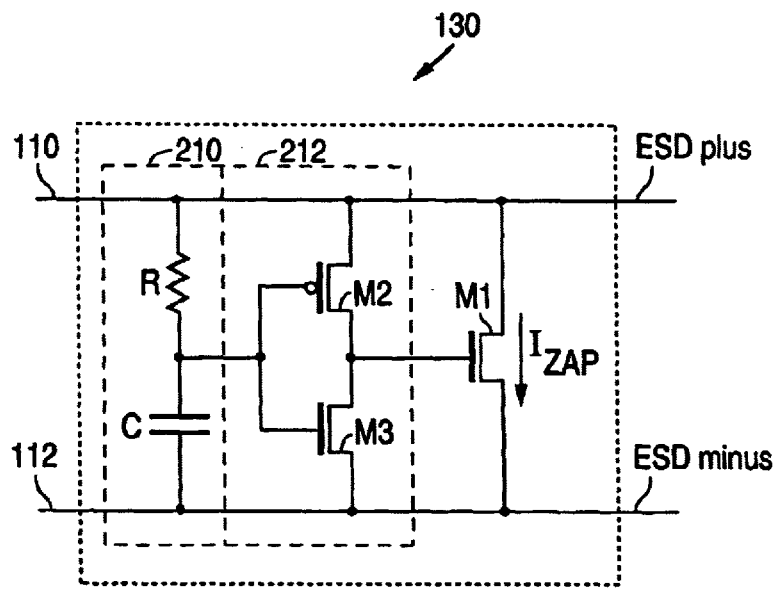
FIG. 2 is a schematic diagram illustrating an example of corner clamp 116.

In contrast, if pad 106 adjacent to pad 104 in FIG. 1 is zapped positively with respect to pad 104, the ESD current has to travel from pad 106 through the upper diode D1 associated with pad 106. From here, the current has to travel down the length of ESD plus ring 110 to corner clamp 116. From here, the current has to travel back to the lower diode D2 associated with pad 104, and out pad 104. The voltage buildup due to the IR drop in the ESD plus ring 110 and ESD minus ring 112 can become excessive, especially on a large die, and cause the chip to fail.

Another advantage of the present invention is that the present invention improves ESD performance when pads are zapped across the die. In the present invention, both ESD plus ring 410 and ESD minus ring 412 more effectively conduct the ESD current around the chip by allowing the current to flow in both ESD plus ring 410 and ESD minus ring 412 in parallel immediately after passing thru diode D1 and transistor M12 in the local slave clamp, which minimizes IR drops and improves ESD. With the prior art approaches there is an increased voltage buildup because only ESD plus ring 110 is utilized for a maximum of ½ the chip dimension before being shunted to ESD minus ring 112.

Figure 7A:
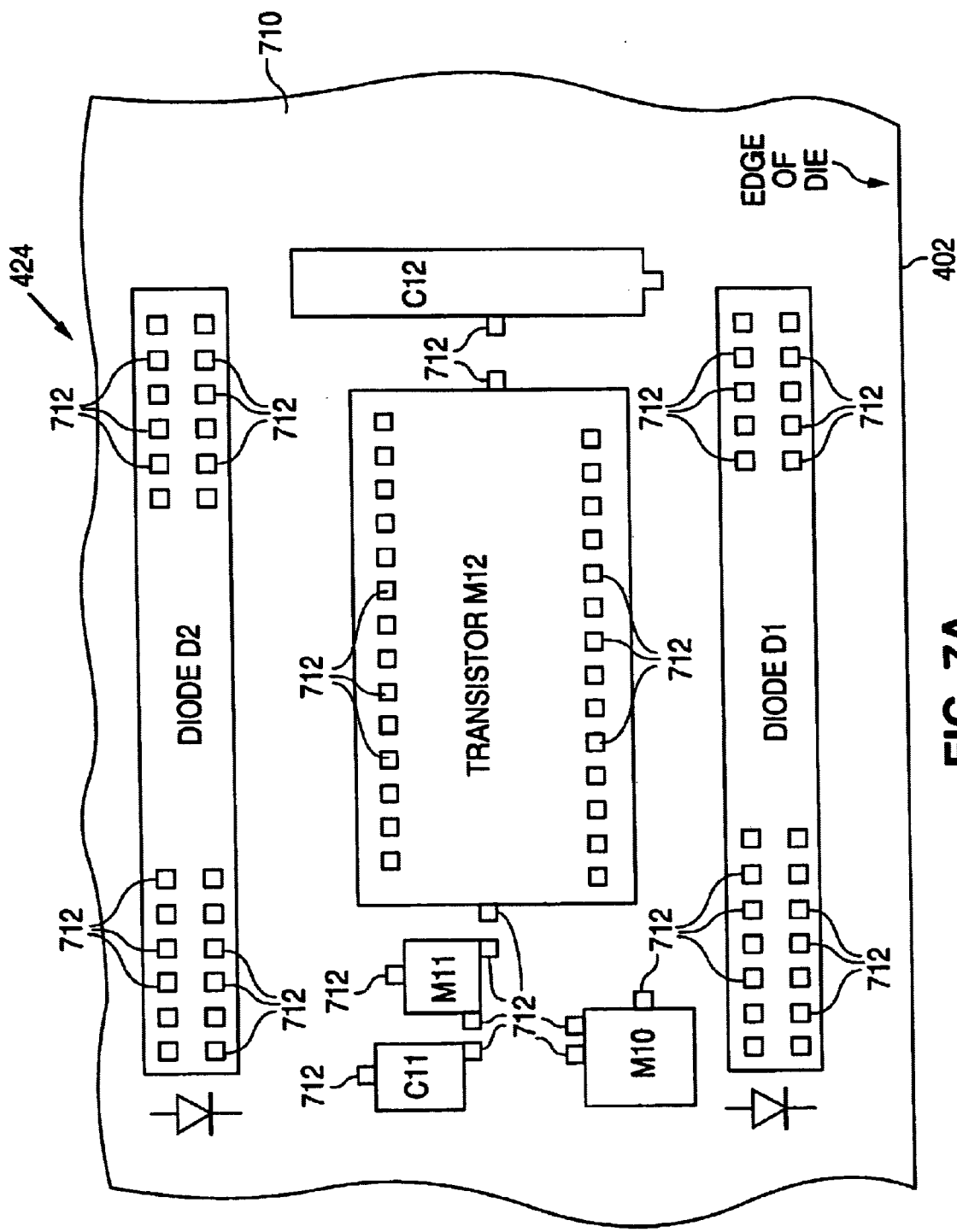
FIGS. 7A–7F are a series of plan views illustrating an example of the physical layout of slave clamp circuit 424 in accordance with the present invention.

FIGS. 7A–7F show a series of plan views that illustrate an example of the physical layout of slave clamp circuit 424 in accordance with the present invention. As shown in FIG. 7A, diode D1 and diode D2 are formed in a semiconductor material 710. Diodes D1 and D2 are formed as P+/N− single finger diodes to have a P+ area of approximately 100 square microns. Diodes D1 and D2 can be reduced from 100 square microns to 50 square microns for RF applications to minimize capacitance.

In addition, transistors M10–M12 and capacitors C11 and C12 are formed in and on material 710 between first and second diodes D1 and D2. Transistor M10 is formed adjacent to diode D1, while transistor M11 and capacitor C11 are formed adjacent to diode D2. Transistor M12 and capacitor C12 are formed midway between diodes D1 and D2. (Devices should not be formed in the bottom 10 um of the I/O cell area (the distance from the edge of diode D1 to the edge of the die) to avoid possible mechanical fracturing of a device in this high stress area of the die.)

Circuit 424 also includes a number of contacts 712 that are formed through a first layer of dielectric material formed on die 402 to make electrical connections with diodes D1 and D2, transistors M10–M12, and capacitors C11 and C12. (The number and placement of contacts 712 are merely illustrative, and are not intended to limit the present invention.)

Figure 7B:
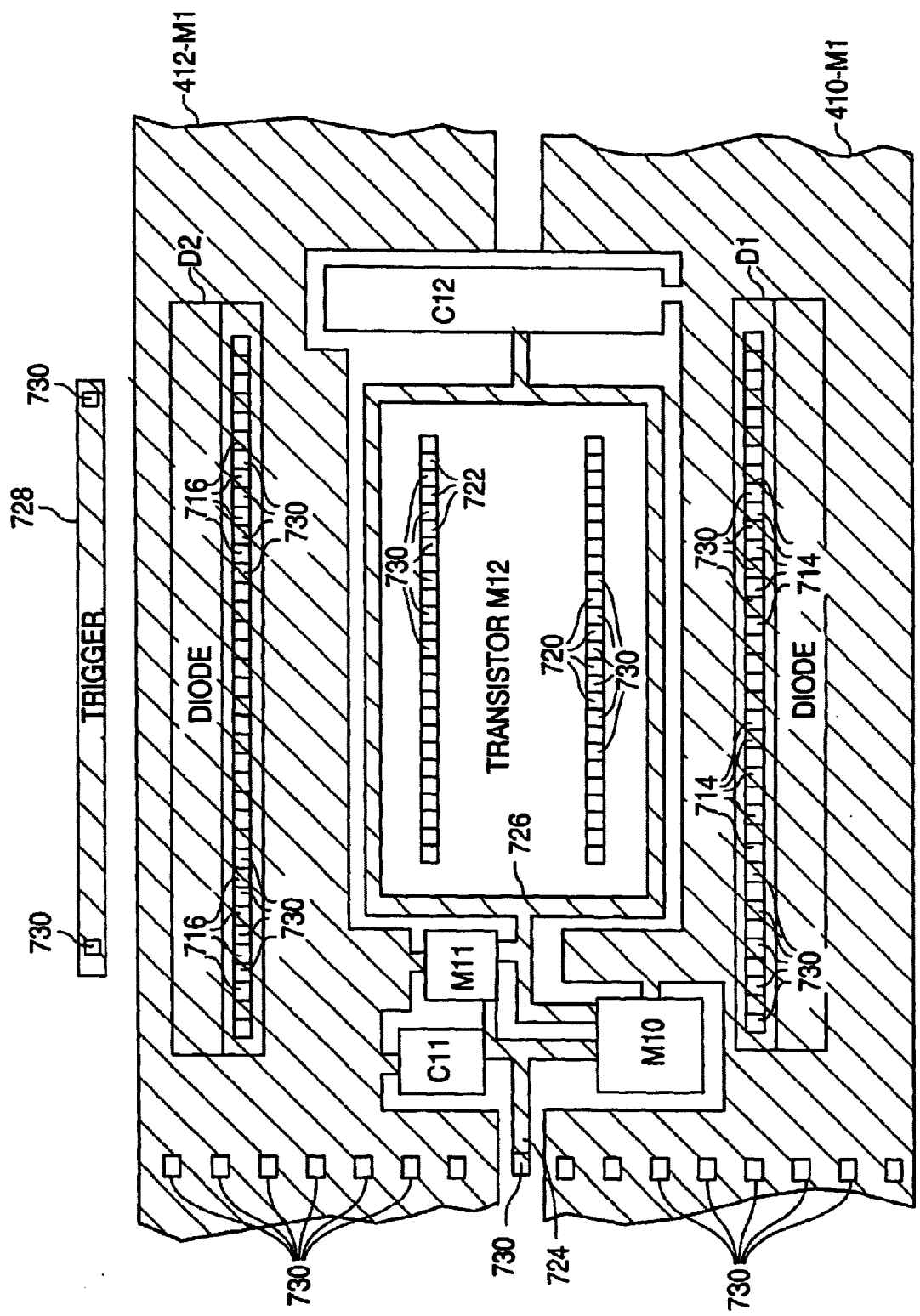

Referring to FIG. 7B, ESD plus ring 410 and ESD minus ring 412 are formed from a first layer of metal (M1) as an ESD plus ring 410-M1 and an ESD minus ring 412-M1. ESD plus ring 410-M1, which is drawn out to the edge of the die, makes electrical connections with the contacts 712 that are connected to the cathode of diode D1, transistor M10, and capacitor C12.

ESD minus ring 412-M1 makes electrical connections with the contacts 712 that are connected to the anode of diode D2, transistor M11, and capacitor C11. (The ESD rings traverse from left to right, forming a routing pin at the edges of the pad for the place and route tool to route continuous ESD rings around the die.) ESD plus ring 410-M1 and ESD minus ring 412-M1 also have openings.

In addition, circuit 424 includes a metal trace 714 that is formed in the opening in ESD plus ring 410-M1. Trace 714 makes electrical connections with the contacts 712 that are connected to the anode of diode D1. Circuit 424 also includes a metal trace 716 that is formed in the opening in ESD minus ring 412-M1. Trace 716 makes electrical connections with the contacts 712 that are connected to the cathode of diode D2. (Diodes D1 and D2 are drawn to about 80% of the width of the to-be-formed pads 404. This minimizes the sizes of the openings formed in ESD plus and minus rings 410-M1 and 412-M2, and maximizes the metal connection down to diodes D1 and D2.)

Further, circuit 424 includes a metal trace 720 that makes electrical connections with the contacts 712 that are connected to the drain of transistor M12, and a metal trace 722 that makes electrical connections with the contacts 712 that are connected to source of transistor M12.

In addition, circuit 424 includes a metal trace 724 that makes electrical connections with the contacts 712 that are connected to transistors M10 and M11 and capacitor C11. A metal trace 726 also makes electrical connections with the contacts 712 that are connected to transistors M10, M11, and M12, and capacitor C12. Further, a metal trace 728 is formed on the first layer of dielectric material. Traces 714, 716, 720, 722, 724, 726, and 728 are formed from the first layer of metal (M1).

Circuit 424 additionally includes a number of vias 730 that are formed through a second layer of dielectric material to make electrical connections with rings 410 and 412, and traces 714, 716, 720, and 722. (The number and placement of vias 730 are merely illustrative, and are not intended to limit the present invention.) The second layer of dielectric material is formed on the first layer of dielectric material.

Figure 7C:
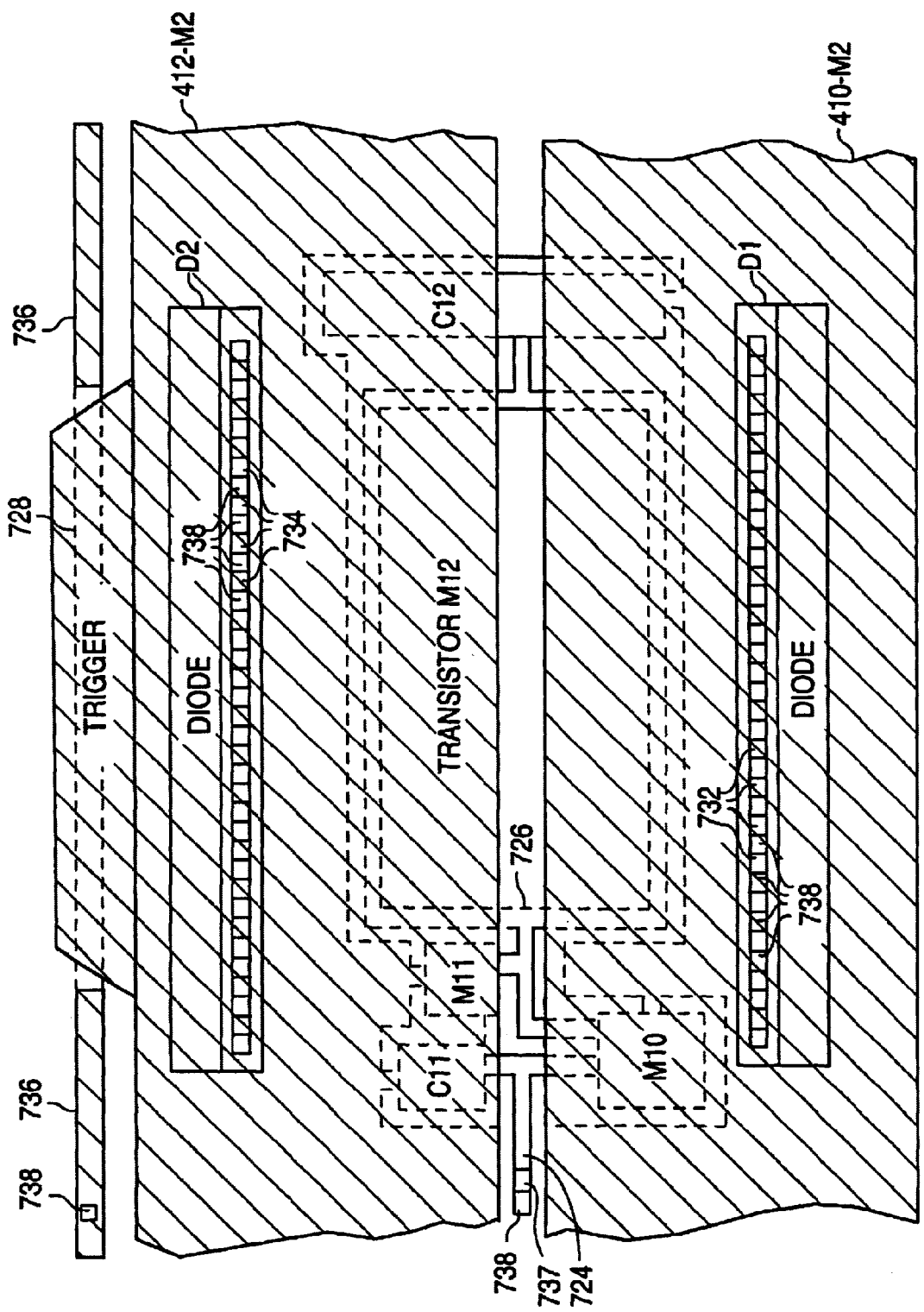

Referring to FIG. 7C, ESD plus ring 410 and ESD minus ring 412 are again formed from a second layer of metal (M2) as an ESD plus ring 410-M2 and an ESD minus ring 412-M2. ESD plus ring 410-M2 makes electrical connections with the vias 730 that are connected to ESD plus ring 410-M1, and the drain of transistor M12. ESD minus ring 412-M2 makes electrical connections with the vias 730 that are connected to ESD minus ring 412-M1 and the source of transistor M12.

In addition, circuit 424 includes a metal trace 732 that makes electrical connections with the vias 730 that are electrically connected to the anode of diode D1. A metal trace 734 also makes electrical connections with the vias 730 that are connected to the cathode of diode D2. Further, a metal trace 736 makes electrical connections with the vias 730 that are connected to metal trace 728. In addition, a metal trace 737 makes electrical connections with the vias 730 that are connected to metal trace 724. Traces 732, 734, 736, and 737 are formed from the second layer of metal (M2).

Circuit 424 additionally includes a number of vias 738 that are formed through a third layer of dielectric material to make electrical connections with traces 732, 734, and 736. (The number and placement of vias 738 are merely illustrative, and are not intended to limit the present invention.) The third layer of dielectric material is formed on the second layer of dielectric material.

In addition, ESD minus ring 412-M2 is also formed over metal trace 728 to shield trace 728. By shielding metal trace 728 with ESD minus ring 412-M1, which is substantially at ground during normal operation, noise coupling is minimized. As a result, false triggering of the clamps is unlikely to occur.

Circuit layout should be drawn in second metal layer M2 and below as possible to keep as much of the circuit interconnect in the first metal layer M1 and polysilicon. This helps to maintain as much solid M2 as possible for low resistance ESD plus and minus rings 410 and 412, as well as keep the critical slave clamp circuits as protected as possible.

Figure 7D:
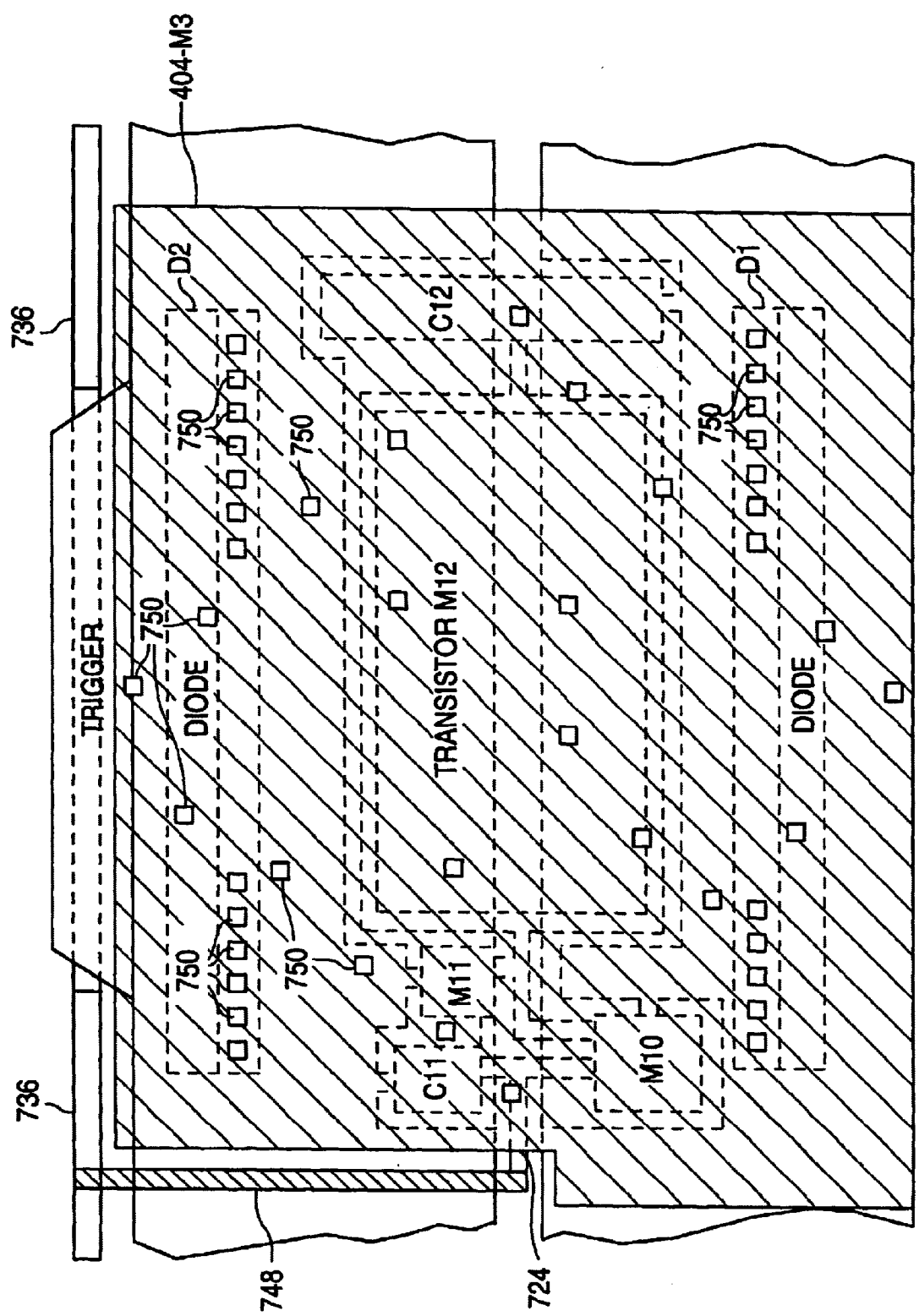

Referring to FIG. 7D, a pad 404 is formed from a third layer of metal (M3) to form a pad 404-M3. Pad 404-M3 makes electrical connections with a number of the vias 738 that are electrically connected to the anode of diode D1, and the cathode of diode D2. Circuit 424 further includes a metal trace 748 that makes electrical connections with vias 738 that are connected to trace 724 and trace 736. Trace 748 is formed from the third layer of metal (M3).

Circuit 424 additionally includes a number of vias 750 that are formed through a fourth layer of dielectric material to make electrical connections with pad 404-M3. (The number and placement of vias 750 are merely illustrative, and are not intended to limit the present invention.) The fourth layer of dielectric material is formed on the third layer of dielectric material.

Referring to FIG. 7E, pad 404 is again formed from a fourth layer of metal (M4) to form pad 404-M4. Pad 404-M4 makes electrical connections with the vias 750 (shown as dashed boxes) that are electrically connected to pad 404-M3. Further, circuit 424 includes a number of vias 752 that are formed through a fifth layer of dielectric material to make electrical connections with pad 404-M4. (The number and placement of vias 752 are merely illustrative, and are not intended to limit the present invention.) The fifth layer of dielectric material is formed on the fourth layer of dielectric material.

Referring to FIG. 7F, pad 404 is again formed from a fifth layer of metal (M5) to form a pad 404-M5. (Although the present invention has been described in terms of five metal layers, the present invention applies to processes that use four or more metal layers. In the case of four metal layers, metal layers M1 and M2 form the ESD plus and ESD minus rings, while metal layers M3 and M4 form the PAD metal.) Pad 404-M5 makes electrical connections with a number of the vias 752 that are electrically connected to pad 404-M4.

Figure 7E:
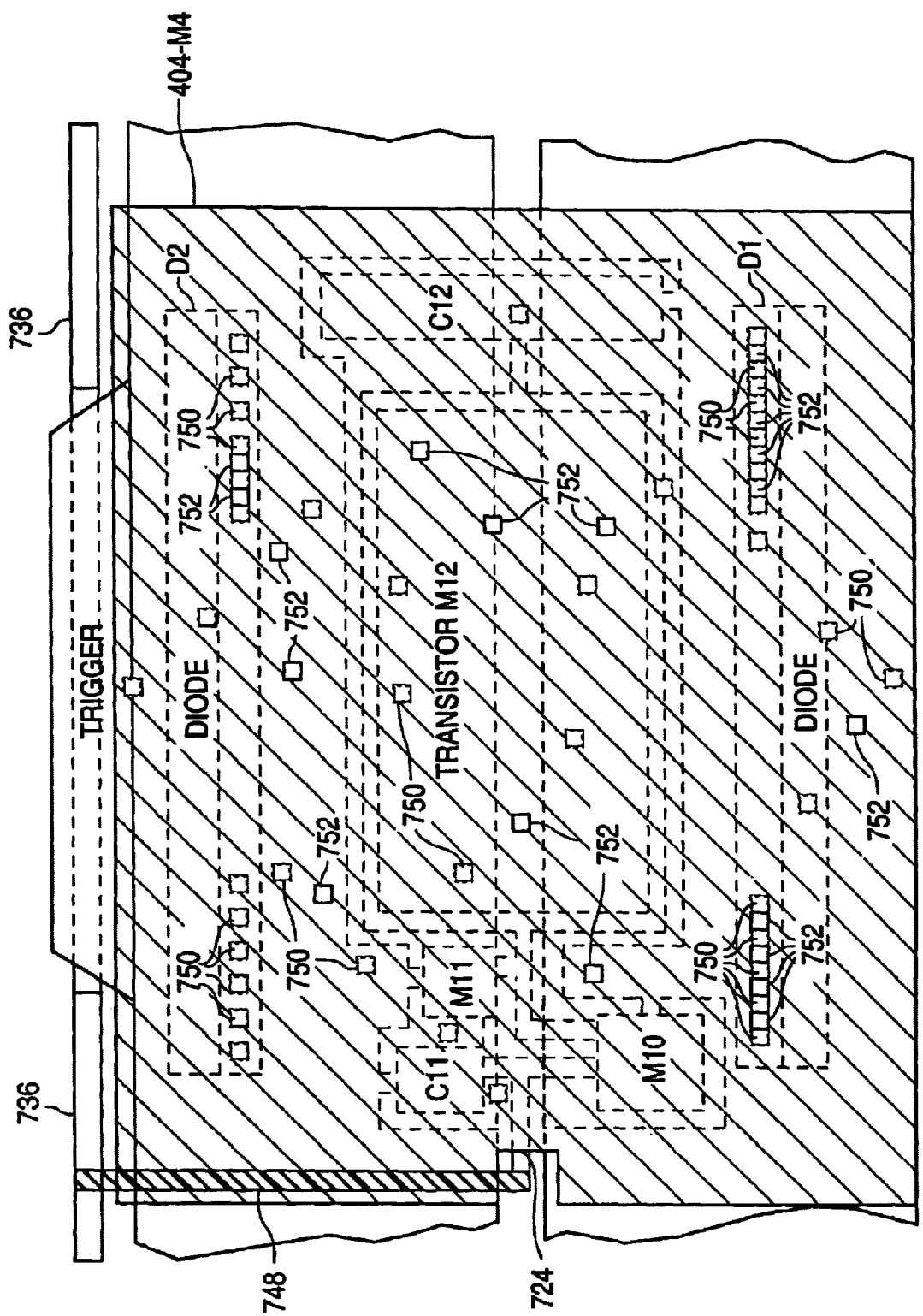
Figure 7F:
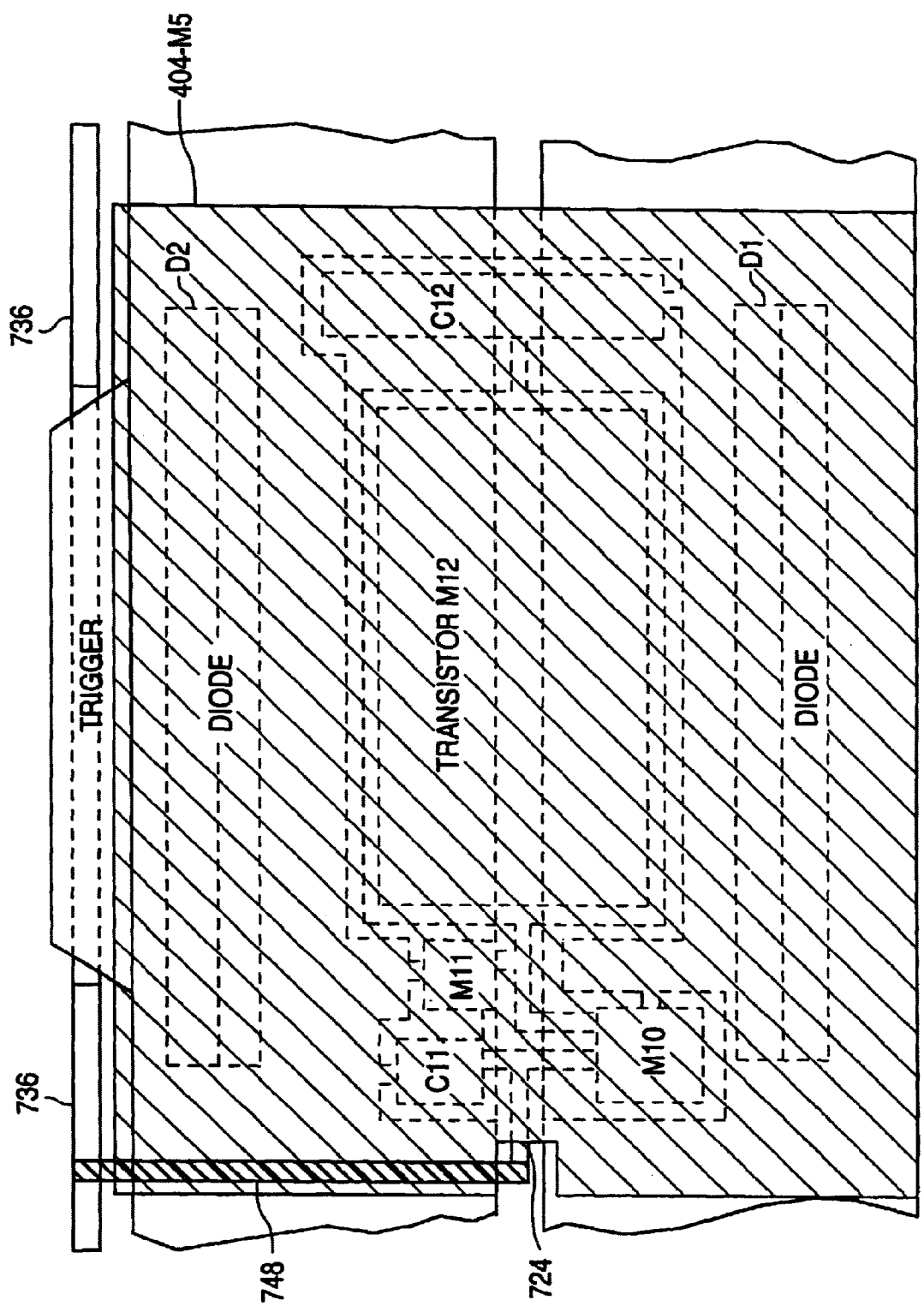

The vias are staggered so that a via connected to a metal layer is not vertically aligned with another via connected to the metal layer. (FIG. 7E shows an example where vias 750 and 752 are staggered.) The staggering decouples mechanical stress from propagating down to the underlying layers. When vias are stacked (not staggered), the vias form a pillar. When force is applied to the surface of the pad by, for example, wire bond or wafer probe, the force can be transmitted down to the surface of the semiconductor die.

Thus, in accordance with the present invention, the ESD plus and minus rings 410 and 412 are formed below the metal-3 through metal-5 layers that are used to form pad 404. As a result, one advantage of the present invention is that the present invention substantially reduces the size of the I/O cell height and the size of the die.

As noted above, the cell height of a prior art I/O cell is defined by the size requirements of the pad, the pair of ESD plus and minus rings, the pair of clean power and ground rings, and the pair of dirty power and ground rings. However, by placing the ESD plus and minus rings 410 and 412 below pads 404-M3, 404-M4, and 404-M5, the I/O cell height is reduced by about 25%. Experimental results have indicated a saving of three mils in I/O cell height which, since I/O cells are formed on both sides of the die, reduces the width of the die by approximately six mils.

Another advantage of the present invention is that, since the ESD diodes are located directly under pads 404-M3, 404-M4, and 404-M5, a much shorter path exists between the diodes and the pads. Thus, metal resistance is minimized, thereby reducing the IR drop across the path during an ESD event. In addition, since the slave clamp circuits are located right next to the ESD diodes under the pad, metal resistance is again minimized.

Thus, the present invention provides significant improvements in the in I/O cell size, and the maximum ESD current ($I_{ZAP}$) that a semiconductor chip can withstand.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. An electrostatic discharge (ESD) protection circuit formed on a semiconductor die, the die having a periphery, the ESD protection circuit comprising:
   an ESD plus ring formed on the die around the periphery of the die;
   an ESD minus ring formed on the die around the periphery of the die;
   a trigger ring formed on the die around the periphery of the die; and
   a plurality of first clamps formed on the die, each first clamp having:
      a first diode formed on the die, the first diode being connected to a pad and the ESD plus ring;
      a second diode formed on the die, the second diode being connected to the pad and the ESD minus ring;
      a first transistor connected to the ESD plus ring, the trigger ring, and a first node;
      a second transistor connected to the ESD minus ring, the trigger ring, and the first node; and
      a third transistor connected to the ESD plus ring, the ESD minus ring, and the first node.

2. The ESD protection circuit of claim 1 and further comprising a plurality of second clamps, each second clamp having:
   a timing circuit connected to the ESD plus ring and the ESD minus ring, the timing circuit controlling a voltage on a second node;
   a fourth transistor connected to the ESD plus ring and a third node, the fourth transistor responding to the voltage on the second node;
   a fifth transistor connected to the ESD minus ring and the third node, the fifth transistor responding to the voltage on the second node; and
   a sixth transistor connected to the ESD plus ring, the ESD minus ring, and the third node.

3. The ESD protection circuit of claim 2 wherein the first transistor turns on when a voltage on the ESD plus ring is greater than the voltage on the second node by a predetermined amount.

4. The ESD protection circuit of claim 3 wherein the fourth transistor turns on when the voltage on the ESD plus ring is greater than the voltage on the second node by a predetermined amount.

5. The ESD protection circuit of claim 4 and further comprising a resistor formed between the first node, and the fourth and fifth transistors.

6. The ESD protection circuit of claim 1 wherein each pad has a corresponding first clamp.

7. The ESD protection circuit of claim 1 wherein
   the first diode is formed on the semiconductor die;
   the second diode is formed on the semiconductor die spaced apart from the first diode;
   the ESD plus ring is formed over the first diode;
   the ESD minus ring is formed over the second diode; and
   a pad is formed over the ESD plus ring.

8. The ESD protection circuit of claim 7 wherein the pad is formed over the ESD minus ring.

9. The ESD protection circuit of claim 8 wherein:
   the third transistor is formed on the semiconductor die;
   the ESD plus ring is formed over and electrically connected to the third transistor; and
   the ESD minus ring is formed over and electrically connected to the third transistor.

10. The ESD protection circuit of claim 9 wherein:
    the first transistor is formed on the semiconductor die; and
    the ESD plus ring is formed over and electrically connected to the first transistor.

11. The ESD protection circuit of claim 10 wherein:
    the second transistor is formed on the semiconductor die; and
    the ESD minus ring is formed over and electrically connected to the first transistor.

12. The ESD protection circuit of claim 9 wherein:
    the second transistor is formed on the semiconductor die; and
    the ESD minus ring is formed over and electrically connected to the first transistor.

13. The ESD protection circuit of claim 7 wherein the pad formed over the ESD plus ring is electrically connected to the first diode.

14. The ESD protection circuit of claim 13 wherein the pad is formed over the ESD minus ring and electrically connected to the second diode.

15. The ESD protection circuit of claim 1 wherein the pad has three or more metal layers.

16. The ESD protection circuit of claim 15 wherein
    each metal layer of the pad is connected to a vertically adjacent metal layer of the pad by vias; and
    the vias are staggered so that a via connected to a metal layer is vertically aligned with another via connected to the metal layer.

17. The ESD protection circuit of claim 1 wherein the ESD minus ring is formed over a portion of the trigger ring.

18. The ESD protection circuit of claim 1 wherein
    a first portion of the trigger ring lies above a second portion of the trigger ring; and
    a second portion of the trigger ring lies above a third portion of the trigger ring.

* * * * *

UNITED STATES PATENT AND TRADEMARK OFFICE
CERTIFICATE OF CORRECTION

PATENT NO. : 6,667,870 B1
DATED : December 23, 2003
INVENTOR(S) : Segervall

It is certified that error appears in the above-identified patent and that said Letters Patent is hereby corrected as shown below:

Title page,
Item [73], Assignee, delete "Natiional Semiconductor Corporation" and replace with -- National Semiconductor Corporation --.

Column 2,
Line 5, delete "Ml" and replace with -- M1 --.

Column 10,
Line 22, delete "Ml" and replace with -- M1 --.

Signed and Sealed this

Sixth Day of April, 2004

JON W. DUDAS
*Acting Director of the United States Patent and Trademark Office*